1

United States Patent
Takahashi et al.

(10) Patent No.: US 8,089,180 B2
(45) Date of Patent: Jan. 3, 2012

(54) INTEGRATED CIRCUIT DEVICE, METHOD OF CONTROLLING OPERATION OF INTEGRATED CIRCUIT DEVICE, AND METHOD OF FABRICATING INTEGRATED CIRCUIT DEVICE

(75) Inventors: Yuka Takahashi, Kyoto (JP); Norihiko Mizobata, Osaka (JP)

(73) Assignee: Panasonic Corporation, Osaka (JP)

( * ) Notice: Subject to any disclaimer, the term of this patent is extended or adjusted under 35 U.S.C. 154(b) by 101 days.

(21) Appl. No.: 12/282,214

(22) PCT Filed: Jun. 29, 2007

(86) PCT No.: PCT/JP2007/063158
§ 371 (c)(1),
(2), (4) Date: Sep. 9, 2008

(87) PCT Pub. No.: WO2008/087756
PCT Pub. Date: Jul. 24, 2008

(65) Prior Publication Data
US 2009/0045866 A1    Feb. 19, 2009

(30) Foreign Application Priority Data

Jan. 16, 2007    (JP) .................... 2007-006771

(51) Int. Cl.
*H01H 35/14*    (2006.01)
*H01H 37/00*    (2006.01)
*H01H 47/24*    (2006.01)
*H01H 47/26*    (2006.01)

(52) U.S. Cl. ........................ 307/117; 327/512
(58) Field of Classification Search ............... None
See application file for complete search history.

(56) References Cited

U.S. PATENT DOCUMENTS

| 6,028,472 | A * | 2/2000 | Nagumo | 327/512 |
| 6,076,161 | A * | 6/2000 | Ho | 713/2 |
| 6,630,754 | B1 * | 10/2003 | Pippin | 307/117 |
| 6,815,643 | B2 | 11/2004 | Der Ropp | |
| 6,975,047 | B2 * | 12/2005 | Pippin | 307/117 |
| 2004/0093601 | A1 * | 5/2004 | Master et al. | 718/102 |

(Continued)

FOREIGN PATENT DOCUMENTS

JP    62-052620    3/1987

(Continued)

OTHER PUBLICATIONS

English Machine translation of JP 2002-111006 A; Apr. 12, 2002, Kadowaki et al.*

(Continued)

*Primary Examiner* — Rexford Barnie
*Assistant Examiner* — Justen Fauth
(74) *Attorney, Agent, or Firm* — McDermott Will & Emery LLP (57) ABSTRACT

Disclosed is an integrated circuit device comprising a startup operation circuit (101) for carrying out processing necessary for startup and a post-startup operation circuit (102) for carrying out a main operation after completion of the processing necessary for startup, wherein the post-startup operation circuit (102) has an operation guaranteed temperature whose lower limit is higher than a lower limit of an operation guaranteed temperature of the startup operation circuit (101), and the post-startup operation circuit (102) starts the main operation after a temperature of the integrated circuit device exceeds a threshold temperature which is equal to the lower limit of the operation guaranteed temperature of the post-startup operation circuit (102).

7 Claims, 6 Drawing Sheets

U.S. PATENT DOCUMENTS

| | | | |
|---|---|---|---|
| 2005/0226165 A1* | 10/2005 | Pope et al. | 370/251 |
| 2005/0288887 A1 | 12/2005 | Satsukawa | |
| 2006/0125446 A1* | 6/2006 | Tupman et al. | 320/132 |
| 2006/0131609 A1* | 6/2006 | Kinoshita et al. | 257/202 |
| 2006/0145673 A1* | 7/2006 | Fogg et al. | 323/282 |

FOREIGN PATENT DOCUMENTS

| | | |
|---|---|---|
| JP | 6-265593 | 9/1994 |
| JP | 2002-111006 | 4/2002 |
| JP | 2004-006473 | 1/2004 |
| JP | 2005-340486 | 12/2005 |

OTHER PUBLICATIONS

English machine translation of JP 2004-006473 A; Jan. 8, 2004, Ishikawa et al.*

* cited by examiner

INTEGRATED CIRCUIT DEVICE, METHOD OF CONTROLLING OPERATION OF INTEGRATED CIRCUIT DEVICE, AND METHOD OF FABRICATING INTEGRATED CIRCUIT DEVICE

RELATED APPLICATIONS

This application is the U.S. National Phase under 35 U.S.C. §371 of International Application No. PCT/JP2007/063158, filed on Jun. 29, 2007, which in turn claims the benefit of Japanese Application No. 2007-006771, filed on Jan. 16, 2007, the disclosures of which Applications are incorporated by reference herein.

TECHNICAL FIELD

The present invention relates to an integrated circuit device whose startup sequence is controlled according to temperatures, a method of controlling an operation of the integrated circuit device, and a method of fabricating the integrated circuit device.

BACKGROUND ART

Some sorts of integrated circuit devices are required to guarantee the operation in a relatively wide temperature range from lower temperatures to higher temperatures. Such integrated circuit devices therefore need to be designed to guarantee the operation from lower temperatures to higher temperatures.

An example of such integrated circuit devices is a gate-array type or standard-cell type integrated circuit device in which at least part of transistors are arranged in a matrix and predetermined driver wirings are formed for selected groups of transistors, wherein a voltage change of a PN junction of a transistor that is not related to a predetermined semiconductor integrated circuit is utilized to measure the temperature of the integrated circuit device, and the result of the measurement is fed back for control, such as switching to a cooling device or to an emergency operation, for example (see Patent Document 1, for example).

Patent Document 1: Japanese Laid-Open Patent Publication No. 6-265593

DISCLOSURE OF INVENTION

Problems to be Solved by the Invention

However, size reduction of electronic devices leads to larger scales and higher speeds of integrated circuit devices, and hence, the number of transistors in an integrated circuit device is significantly increasing. It is therefore becoming difficult to achieve a design which guarantees the high-speed operation in a wide temperature range from lower temperatures to high temperatures.

The present invention was conceived in view of the above problems. An object of the present invention is to make it possible to easily achieve a design which guarantees an operation guaranteed temperature range that is required for the integrated circuit device.

Means for Solving the Problems

In order to achieve the above objective, an embodiment of the present invention includes: a startup operation circuit for carrying out processing necessary for startup; and a post-startup operation circuit for carrying out a main operation after completion of the processing necessary for startup, wherein the post-startup operation circuit has an operation guaranteed temperature whose lower limit is higher than a lower limit of an operation guaranteed temperature of the startup operation circuit, and the post-startup operation circuit starts the main operation after a temperature of the integrated circuit device exceeds a threshold temperature which is equal to the lower limit of the operation guaranteed temperature of the post-startup operation circuit.

Effects of the Invention

According to the present invention, it is possible to easily achieve a design which guarantees an operation guaranteed temperature range that is required for an integrated circuit device.

DESCRIPTION OF REFERENCE NUMERALS 100 integrated circuit device
101 startup operation circuit
102 post-startup operation circuit
103 temperature detecting circuit
200 integrated circuit device
201 startup operation circuit
210 temperature detecting circuit
300 integrated circuit device
301 process parameter circuit
302 temperature detecting circuit
400 integrated circuit device
401 temperature detecting circuit
402 post-startup operation circuit
500 integrated circuit device
510 temperature detecting circuit
600 integrated circuit device
601 clock generating circuit
602 post-startup operation circuit
603 temperature detecting circuit

BEST MODE FOR CARRYING OUT THE INVENTION

Integrated circuit devices according to the embodiments of the present invention will hereinafter be described with reference to the drawings. Each integrated circuit device described hereinafter is of a type in which, at the time of startup, not the entire integrated circuit device operates but such a situation is enough in which only a specific function, such as a function of reading an enormous amount of programs necessary for the operation of the integrated circuit device or a function of waiting until a clock multiplying circuit in the integrated circuit device will be in stable operation, is ready to be performed.

In the following embodiments, an element which has a similar function as an element once described is labeled with the same reference sign and the description thereof is omitted.

First Embodiment of the Invention (Configuration of Integrated Circuit Device 100)

Figure 1:
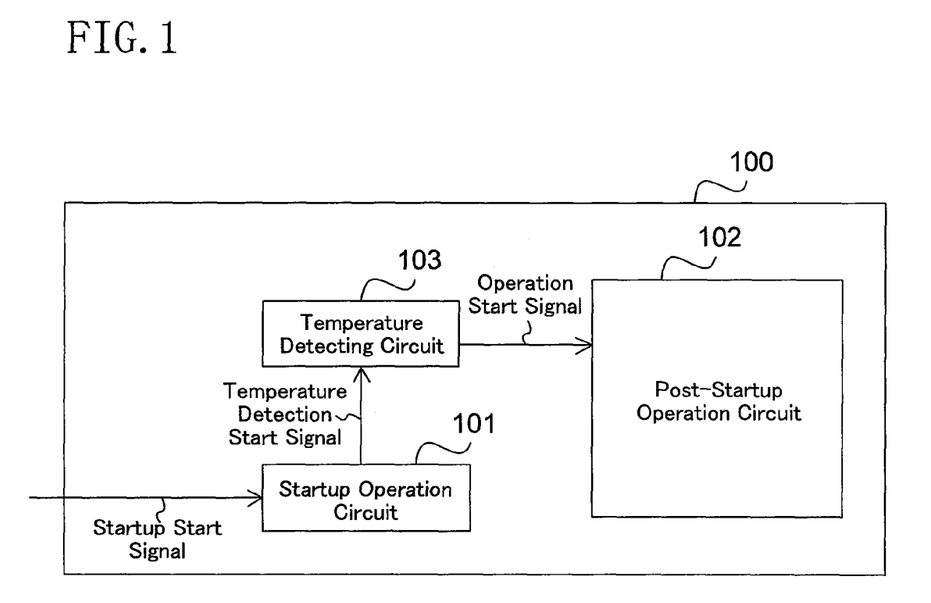
FIG. 1 is a block diagram showing a configuration of the integrated circuit device 100 of the first embodiment.

FIG. 1 is a block diagram showing a configuration of the integrated circuit device 100 of the first embodiment of the present invention. The integrated circuit device 100 includes a startup operation circuit 101, a post-startup operation circuit 102, and a temperature detecting circuit 103 as shown in FIG. 1.

The startup operation circuit 101 starts to operate upon receipt of a startup start signal and carries out processing necessary for startup of the integrated circuit device 100. The startup start signal is a signal for instructing the integrated circuit device 100 to start up. The startup start signal is input from a device external to the integrated circuit device 100 by, for example, power-on. The processing necessary for startup includes, for example, detecting a startup start signal, starting an internal clock operation, initializing the system, and downloading data necessary for the operation from a memory device connected to an external device.

Further, the startup operation circuit 101 controls the temperature detecting circuit 103. Specifically, upon receipt of a startup start signal, the startup operation circuit 101 sends a temperature detection start signal to the temperature detecting circuit 103, thereby instructing the temperature detecting circuit 103 to start detecting the temperature of the integrated circuit device 100.

The post-startup operation circuit 102 starts the main operation when the processing by the startup operation circuit 101 completes and an operation start signal is received by the post-startup operation circuit 102. The operation start signal is output from the temperature detecting circuit 103.

The startup operation circuit 101 and the post-startup operation circuit 102 are configured such that the lower limit of the operation guaranteed temperature of the post-startup operation circuit 102 is higher than the lower limit of the operation guaranteed temperature of the startup operation circuit 101.

Specifically, the startup operation circuit 101 is designed to guarantee the operation in a wide temperature range from lower temperatures (temperatures lower than a predetermined temperature (described later)) to higher temperatures. Herein, the predetermined temperature is, for example, a temperature to which the integrated circuit device 100 inevitably reaches during the main operation or an ambient temperature of the place where the integrated circuit device 100 is used.

The post-startup operation circuit 102 is designed to guarantee the operation at temperatures equal to or higher than the predetermined temperature, without guaranteeing the operation at temperatures lower than the predetermined temperature. In other words, the lower limit of the operation guaranteed temperature of the post-startup operation circuit 102 (hereinafter referred to as "threshold temperature") is equal to the predetermined temperature.

As for the startup operation circuit 101 and the post-startup operation circuit 102 as described above, two different types of circuits are formed by using, for the circuit 101, a process library with which the operation is guaranteed over a wide temperature range from lower temperatures (temperatures lower than the aforementioned predetermined temperature) to high temperatures and, for the circuit 102, a process library with which the operation is guaranteed only at temperatures equal to or higher than the predetermined temperature.

The temperature detecting circuit 103 starts detecting the temperature of the integrated circuit device 100 upon receipt of a temperature detection start signal from the startup operation circuit 101. Specifically, the temperature detecting circuit 103 includes a temperature detecting transistor or is configured to measure, for example, the value of a current flowing in the integrated circuit device 100 or the temperature of a terminal of the integrated circuit device 100, thereby detecting the temperature of the integrated circuit device 100.

The threshold temperature (the lower limit of the operation guaranteed temperature of the post-startup operation circuit 102) is set beforehand in this temperature detecting circuit 103. The temperature detecting circuit 103 sends an operation start signal to the post-startup operation circuit 102 when the detected temperature reaches the threshold temperature.

(Operation of Integrated Circuit Device 100)

If the integrated circuit device 100 receives a startup start signal from an external device after power-on, the startup operation circuit 101 starts to operate first to carry out processing necessary for startup. Further, the startup operation circuit 101 outputs a temperature detection start signal to the temperature detecting circuit 103. In response to the temperature detection start signal, the temperature detecting circuit 103 starts detecting the temperature of the integrated circuit device 100. If the detected temperature exceeds the threshold temperature, the temperature detecting circuit 103 outputs an operation start signal to the post-startup operation circuit 102. The post-startup operation circuit 102 starts the main operation upon receipt of the operation start signal. In this way, the entire integrated circuit device 100 starts to operate.

As described above, the integrated circuit device of this embodiment is configured such that the circuit which carries out processing necessary for startup and the circuit which carries out the main operation after completion of the processing necessary for startup have different operation guaranteed temperature ranges. It is therefore possible to narrow the operation guaranteed temperature range of part of the circuit which is not required to operate before completion of the processing necessary for startup. As a result, an integrated circuit device which guarantees a required operation guaranteed temperature range can be easily designed. In addition, it is possible to enhance downsizing and high integration owing to the reduction in circuit size, improve yields and enhance speed owing to timing relaxation, and reduce time and effort for designing.

Second Embodiment of the Invention

Figure 2:
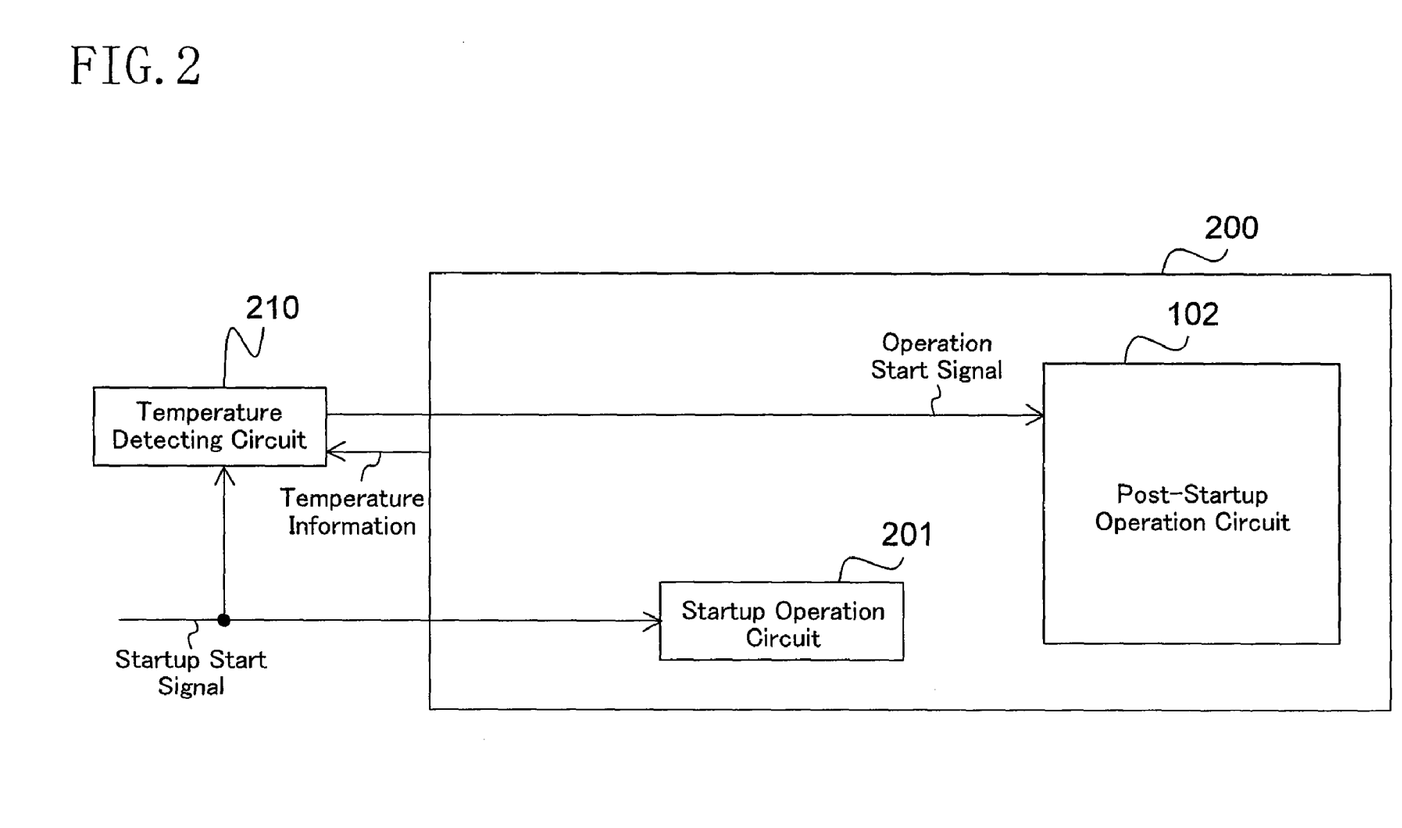
FIG. 2 is a block diagram showing a configuration of the integrated circuit device 200 of the second embodiment.

FIG. 2 is a block diagram showing a configuration of the integrated circuit device 200 of the second embodiment of the present invention. The integrated circuit device 200 is an example of the structure in which a temperature detecting circuit is provided outside the integrated circuit device.

The integrated circuit device 200 includes a post-startup operation circuit 102 and a startup operation circuit 201 and is connected to a temperature detecting circuit 210.

The startup operation circuit 201 carries out processing necessary for startup of the integrated circuit device 200. As is the startup operation circuit 101, the startup operation circuit 201 is designed to guarantee the operation in a wide temperature range from lower temperatures to higher temperatures. The startup operation circuit 201 likewise starts to operate upon receipt of a startup start signal from outside. In this embodiment, too, the startup start signal is a signal for instructing the integrated circuit device to start up and is input from a device external to the integrated circuit device by, for example, power-on.

Unlike the startup operation circuit 101 of the first embodiment, the startup operation circuit 201 does not need to have a function of controlling the temperature detecting circuit.

The temperature detecting circuit 210 starts to operate upon receipt of a startup start signal and obtains temperature information from the integrated circuit device 200. The threshold temperature (the lower limit of the operation guaranteed temperature of the post-startup operation circuit 102) is set beforehand in the temperature detecting circuit 210. When the temperature of the integrated circuit device 200 reaches the threshold temperature, the temperature detecting circuit 210 sends a signal for instructing the post-startup operation circuit 102 to start operation (an operation start signal).

Third Embodiment of Invention

Figure 3:
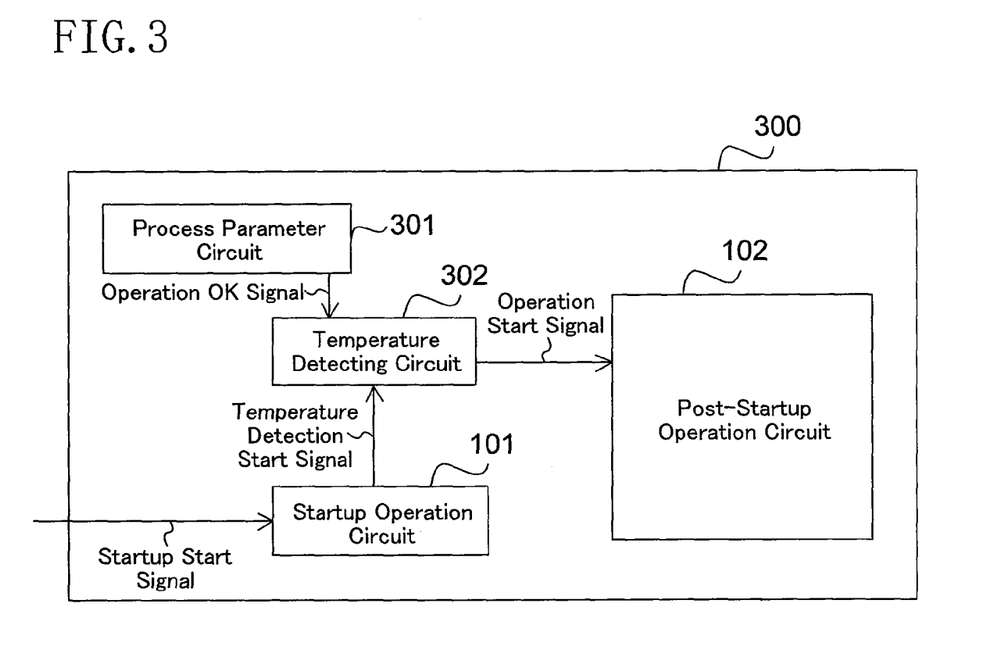
FIG. 3 is a block diagram showing a configuration of the integrated circuit device 300 of the third embodiment.

FIG. 3 is a block diagram showing a configuration of the integrated circuit device 300 of the third embodiment of the present invention. The integrated circuit device 300 includes a process parameter circuit 301 in addition to the components of the integrated circuit device 100 of the first embodiment, and a temperature detecting circuit 302 in substitution for the temperature detecting circuit 103.

The process parameter circuit 301 is designed to have an operation guaranteed temperature whose lower limit is slightly higher than the lower limit of the operation guaranteed temperature of the post-startup operation circuit 102. The process parameter circuit 301, if it operates normally, outputs an operation OK signal to the temperature detecting circuit 302.

The temperature detecting circuit 302 starts detecting the temperature of the integrated circuit device 300 according to a temperature detection start signal output from the startup operation circuit 101. The threshold temperature (the lower limit of the operation guaranteed temperature of the post-startup operation circuit 102) is set beforehand in the temperature detecting circuit 302. The temperature detecting circuit 302 sends an operation start signal when the detected temperature reaches the threshold temperature. However, once the operation OK signal is output from the process parameter circuit 301, the temperature detecting circuit 302 sends an operation start signal to the post-startup operation circuit 102 regardless of the detected temperature.

The process parameter values employed for actual fabrication of the integrated circuit device are reflected in the process parameter circuit 301, and therefore, the integrated circuit device 300 can be normally started even if an appropriate threshold temperature is not set in the temperature detecting circuit 302. Hence, in this embodiment, it is not necessary to check the parameter values of a process library in order to set the threshold temperature.

Fourth Embodiment of Invention

Figure 4:
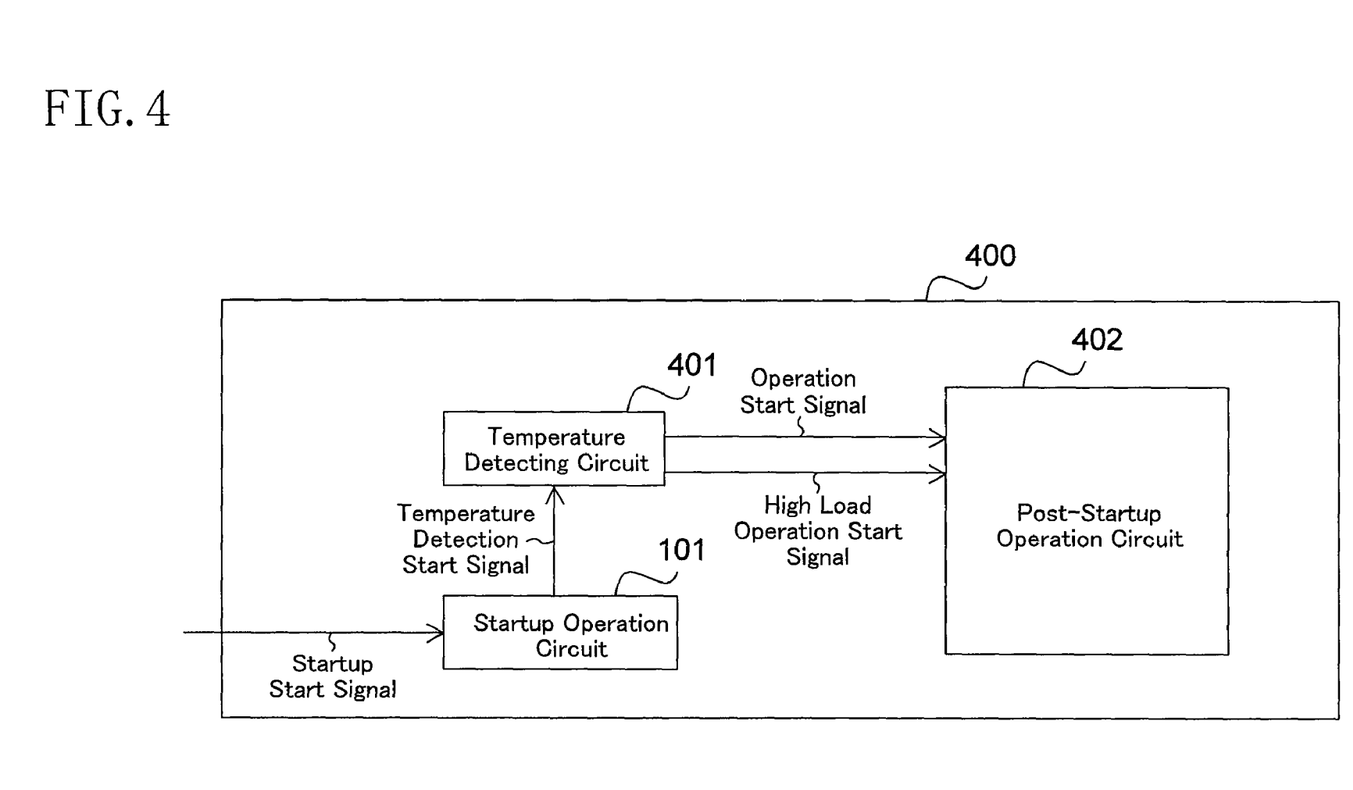
FIG. 4 is a block diagram showing a configuration of the integrated circuit device 400 of the fourth embodiment.

FIG. 4 is a block diagram showing a configuration of the integrated circuit device 400 of the fourth embodiment of the present invention. The integrated circuit device 400 is an example of the structure which includes a mechanism for reducing the time before a post-startup operation circuit starts the main operation.

The integrated circuit device 400 includes a startup operation circuit 101, a temperature detecting circuit 401 and a post-startup operation circuit 402 as shown in FIG. 4.

The temperature detecting circuit 401 starts detecting the temperature of the integrated circuit device 400 according to a temperature detection start signal output from the startup operation circuit 101. The threshold temperature (the lower limit of the operation guaranteed temperature of the post-startup operation circuit 402) is set beforehand in the temperature detecting circuit 401. The temperature detecting circuit 401 sends an operation start signal to the post-startup operation circuit 402 when the detected temperature reaches the threshold temperature that is set.

Further, the temperature detecting circuit 401 sends a high load operation start signal to the post-startup operation circuit 402 till the temperature of the integrated circuit device 400 reaches the threshold temperature. The high load operation start signal is a signal for instructing the post-startup operation circuit 402 to start a high load operation (described later).

The post-startup operation circuit 402 starts the main operation after completion of processing by the startup operation circuit 101.

The post-startup operation circuit 402 is designed to have an operation guaranteed temperature whose lower limit is higher than the lower limit of the operation guaranteed temperature of the startup operation circuit 101. Specifically, the post-startup operation circuit 402 guarantees the operation only at temperatures equal to or higher than the predetermined temperature, without guaranteeing the operation at temperatures lower than the predetermined temperature (see the first embodiment). In other words, the lower limit of the operation guaranteed temperature of the post-startup operation circuit 402 (threshold temperature) is equal to the predetermined temperature.

Further, the post-startup operation circuit 402 is configured to carry out a high load operation upon receipt of a high load operation start signal from the temperature detecting circuit 401.

Herein, the high load operation is an operation by which it is possible to increase the temperature of the integrated circuit device 400. Specifically, a built-in scan circuit or a BIST (Built In Self Test) circuit, for example, is brought into operation to put the integrated circuit device 400 into the high load state, thereby accelerating the increase of the temperature of the integrated circuit device 400.

In this example, the scan circuit or the BIST circuit is brought into operation for the purpose of increasing the toggle rate of the circuit, and therefore, the scan circuit or the BIST circuit does not need to normally operate. In other words, it is not necessary to guarantee the operation of the post-startup operation circuit 402 at temperatures lower than the threshold temperature.

Fifth Embodiment of the Invention

Figure 5:
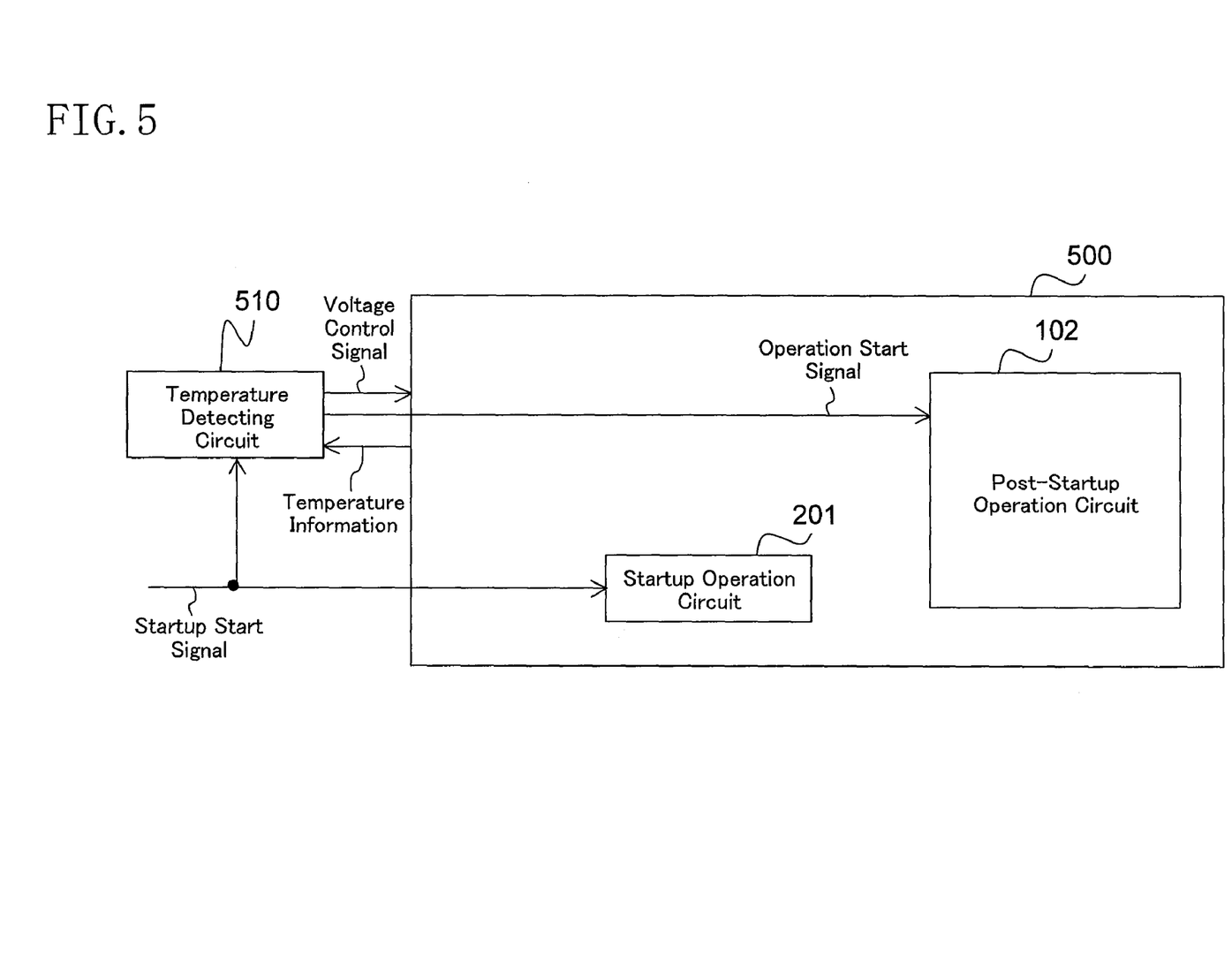
FIG. 5 is a block diagram showing a configuration of the integrated circuit device 500 of the fifth embodiment.

FIG. 5 is a block diagram showing a configuration of the integrated circuit device 500 of the fifth embodiment of the present invention. The integrated circuit device 500 includes a post-startup operation circuit 102 and a startup operation circuit 201 and is connected to a temperature detecting circuit 510 as shown in FIG. 5. Further, the integrated circuit device 500 is configured to have the ability to change the power supply voltage according to a voltage control signal that is input from an external device.

The temperature detecting circuit 510 starts to operate upon receipt of a startup start signal and obtains temperature information from the integrated circuit device 500. The threshold temperature (the lower limit of the operation guaranteed temperature of the post-startup operation circuit 102) is set beforehand in the integrated circuit device 500. The temperature detecting circuit 510 sends an operation start signal to the post-startup operation circuit 102 when the temperature of the integrated circuit device 500 reaches the threshold temperature.

Further, the temperature detecting circuit 510 outputs a voltage control signal to the integrated circuit device 500 till the temperature of the integrated circuit device 500 reaches the threshold temperature with the view of controlling the power supply voltage of the integrated circuit device 500 to be higher than the power supply voltage reached during the main operation. Accordingly, the increase of the temperature of the integrated circuit device 500 is accelerated till the temperature of the integrated circuit device 500 reaches the threshold temperature.

Sixth Embodiment of the Invention

Figure 6:
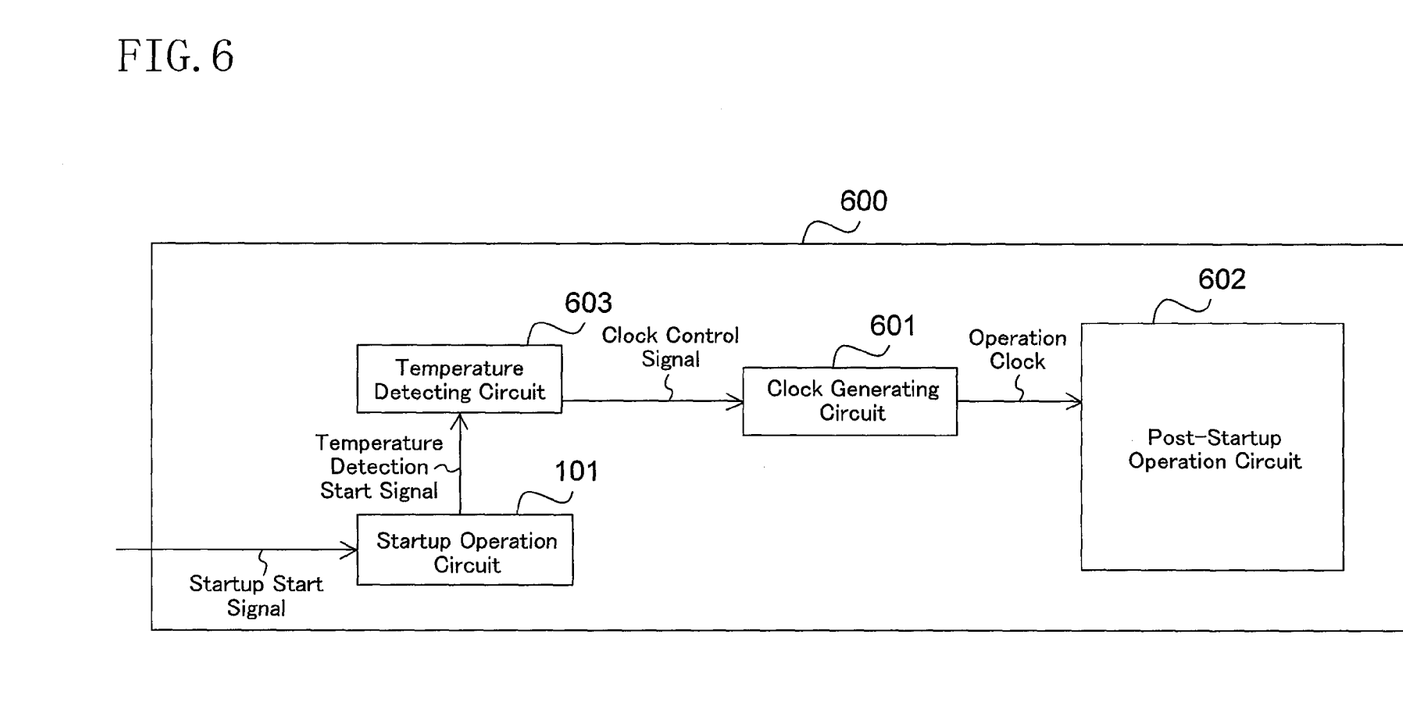
FIG. 6 is a block diagram showing a configuration of the integrated circuit device 600 of the sixth embodiment.

FIG. 6 is a block diagram showing a configuration of the integrated circuit device 600 of the sixth embodiment of the present invention. The integrated circuit device 600 includes a startup operation circuit 101, a clock generating circuit 601, a post-startup operation circuit 602, and a temperature detecting circuit 603 as shown in FIG. 5.

The clock generating circuit 601 outputs, to the post-startup operation circuit 602, an operation clock having a frequency corresponding to a clock control signal that is input to the clock generating circuit 601.

The post-startup operation circuit 602 starts the main operation when the processing by the startup operation circuit 101 is completed.

The post-startup operation circuit 602 is designed to have an operation guaranteed temperature whose lower limit is higher than the lower limit of the operation guaranteed temperature of the startup operation circuit 101. Specifically, the post-startup operation circuit 602 guarantees the operation only at temperatures equal to or higher than the predetermined temperature, without guaranteeing the operation at temperatures lower than the predetermined temperature (see the first embodiment). In other words, the lower limit of the operation guaranteed temperature of the post-startup operation circuit 402 (threshold temperature) is equal to the predetermined temperature.

The temperature detecting circuit 603 starts to operate according to a temperature detection start signal output from the startup operation circuit 101, thereby detecting the temperature of the integrated circuit device 600. The threshold temperature (the lower limit of the operation guaranteed temperature of the post-startup operation circuit 602) is set beforehand in the temperature detecting circuit 603. Until the temperature of the integrated circuit device 600 reaches the threshold temperature, the temperature detecting circuit 603 sends a clock control signal to the clock generating circuit 601 so that the frequency of the operation clock becomes higher than that during the main operation. When the threshold temperature is reached, the temperature detecting circuit 603 sends a clock control signal to the clock generating circuit 601 so that the frequency of the operation clock becomes equal to that during the main operation.

In other words, the post-startup operation circuit 602 operates at high speed till the temperature of the integrated circuit device 600 reaches the threshold temperature. This results in the acceleration of the increase in temperature of the post-startup operation circuit 602.

As above, in the integrated circuit devices of the fourth to sixth embodiments, the increase in temperature of the circuit which starts to operate after completion of processing necessary for startup can be accelerated. It is therefore possible to reduce the time before the integrated circuit device starts the main operation.

In the integrated circuit devices of the first, second, and fourth to sixth embodiments, the threshold temperature given to the temperature detecting circuit is set beforehand in the temperature detecting circuit as described in the above examples. However, the threshold temperature may alternatively be set by a startup operation circuit, for example. In this case, it is possible to check the temperature at which the post-startup operation circuit is operable, using the parameter values of a process library employed for fabrication of the integrated circuit device. Hence, a threshold temperature appropriate for each integrated circuit device can be set and thus it is possible to minimize the time before the post-startup operation circuit starts to operate.

INDUSTRIAL APPLICABILITY

The integrated circuit device according to the present invention provides an effect of making it possible to easily achieve a design which guarantees an operation guaranteed temperature range that is required for the integrated circuit device, and is useful as an integrated circuit device or the like in which a startup sequence is controlled according to temperatures.

The invention claimed is:
1. An integrated circuit device comprising:
a startup operation circuit for carrying out processing necessary for startup; and
a post-startup operation circuit for carrying out a main operation after completion of the processing necessary for startup,
wherein the post-startup operation circuit has a first operation guaranteed temperature range whose lower limit is higher than a lower limit of a second operation guaranteed temperature range of the startup operation circuit,
the post-startup operation circuit operates when a temperature of the post-startup operation circuit is equal to or lower than a threshold temperature, which is the lower limit of the first operation guaranteed temperature range, to increase the temperature of the integrated circuit device, and starts the main operation after the temperature of the integrated circuit device exceeds the threshold temperature,
if the temperature of the post-startup operation circuit is lower than the threshold temperature, the startup operation circuit starts an initializing process necessary for the main operation of the post-startup operation circuit before the temperature of the post-startup operation circuit reaches the threshold temperature,
the first operation guaranteed temperature range is a range of temperature that the post-startup operation circuit can operate normally, and
the second operation guaranteed temperature range is a range of temperature that the startup operation circuit can operate normally.
2. The integrated circuit device of claim 1, wherein a supply voltage is increased until the temperature of the integrated circuit device exceeds the threshold temperature.
3. The integrated circuit device of claim 1, wherein a frequency of a clock signal input to the post-startup operation circuit is increased until the temperature of the integrated circuit device exceeds the threshold temperature.

4. The integrated circuit device of claim 1, wherein
the temperature of the integrated circuit device is detected by a temperature detecting circuit provided inside or outside the integrated circuit device,
the temperature detecting circuit outputs an operation start signal when the temperature of the integrated circuit device exceeds the threshold temperature,
the post-startup operation circuit is configured to start the main operation according to the operation start signal, and
the startup operation circuit sets, at the time of startup, a value indicating the threshold temperature in the temperature detecting circuit.

5. The integrated circuit device of claim 1, further comprising a process parameter circuit which has an operation guaranteed temperature whose lower limit is higher than the lower limit of the operation guaranteed temperature of the post-startup operation circuit,
wherein the process parameter circuit is configured to output an operation OK signal if the process parameter circuit operates normally, and
the post-startup operation circuit starts the main operation after the output of the operation OK signal.

6. A method of controlling an operation of an integrated circuit device including a startup operation circuit for carrying out processing necessary for startup and a post-startup operation circuit for carrying out a main operation after completion of the processing necessary for startup, the post-startup operation circuit having a first operation guaranteed temperature range whose lower limit is higher than a lower limit of a second operation guaranteed temperature range of the startup operation circuit, the method comprising the steps of:
increasing a temperature of the integrated circuit device by operating the post-startup operation circuit when a temperature of the post-startup operation circuit is equal to or lower than a threshold temperature, which is the lower limit of the first operation guaranteed temperature range;
if the temperature of the post-startup operation circuit is lower than the threshold temperature, instructing the startup operation circuit to start an initializing process necessary for the main operation of the post-startup operation circuit before the temperature of the post-startup operation circuit reaches the threshold temperature;
detecting a temperature of the integrated circuit device; and
instructing the post-startup operation circuit to start the main operation when the detected temperature exceeds a threshold temperature which is equal to the lower limit of the operation guaranteed temperature of the post-startup operation circuit,
wherein the first operation guaranteed temperature range is a range of temperature that the post-startup operation circuit can operate normally, and
the second operation guaranteed temperature range is a range of temperature that the startup operation circuit can operate normally.

7. A method of fabricating an integrated circuit device including a startup operation circuit for carrying out processing necessary for startup and a post-startup operation circuit for carrying out a main operation after completion of the processing necessary for startup, the post-startup operation circuit having a first operation guaranteed temperature range whose lower limit is higher than a lower limit of a second operation guaranteed temperature range of the startup operation circuit, the post-startup operation circuit operating when a temperature of the post-startup operation circuit is equal to or lower than a threshold temperature, which is the lower limit of the first operation guaranteed temperature range, to increase the temperature of the integrated circuit device, and starting the main operation after the temperature of the integrated circuit exceeds the threshold temperature, and if the temperature of the post-startup operation circuit is lower than the threshold temperature, the startup operation circuit starting an initializing process necessary for the main operation of the post-startup operation circuit before the temperature of the post-startup operation circuit reaches the threshold temperature, the method comprising the steps of:
preparing a process library for the startup operation circuit;
preparing a process library for the post-startup operation circuit; and
forming two different types of circuits using the process libraries for the startup operation circuit and the post-startup operation circuit,
wherein the first operation guaranteed temperature range is a range of temperature that the post-startup operation circuit can operate normally, and
the second operation guaranteed temperature range is a range of temperature that the startup operation circuit can operate normally.

* * * * *